(12) United States Patent
Gupta et al.

(10) Patent No.: US 7,400,172 B2
(45) Date of Patent: Jul. 15, 2008

(54) MILLER CAPACITANCE TOLERANT BUFFER ELEMENT

(75) Inventors: Sanjay Gupta, New Delhi (IN); Qadeer A. Khan, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/851,381

(22) Filed: Sep. 6, 2007

(65) Prior Publication Data

US 2008/0088340 A1 Apr. 17, 2008

(30) Foreign Application Priority Data

Oct. 16, 2006 (IN) .................................... 2262/06

(51) Int. Cl.
*H03K 19/0175* (2006.01)
*H03K 19/094* (2006.01)
(52) U.S. Cl. ....................................................... 326/83
(58) Field of Classification Search ........................ None
See application file for complete search history.

(56) References Cited

U.S. PATENT DOCUMENTS

| | | | | |
|---|---|---|---|---|
| 4,071,830 A | * | 1/1978 | Huntington | 330/277 |
| 4,472,821 A | * | 9/1984 | Mazin et al. | 377/79 |
| 5,155,449 A | * | 10/1992 | Ito | 330/277 |
| 5,274,284 A | * | 12/1993 | Krenik et al. | 326/62 |
| 5,587,674 A | * | 12/1996 | Danstrom | 327/67 |
| 5,600,274 A | * | 2/1997 | Houston | 327/262 |
| 5,764,093 A | * | 6/1998 | Hayashi et al. | 327/276 |
| 5,796,985 A | | 8/1998 | O'Brien et al. | |
| 5,854,573 A | * | 12/1998 | Chan | 330/292 |
| 5,905,395 A | * | 5/1999 | Pontius | 327/262 |
| 5,986,492 A | * | 11/1999 | Hobbs | 327/284 |
| 6,130,563 A | * | 10/2000 | Pilling et al. | 327/111 |
| 6,252,448 B1 | * | 6/2001 | Schober | 327/259 |
| 6,292,064 B1 | * | 9/2001 | Nagata | 331/117 FE |
| 6,333,656 B1 | * | 12/2001 | Schober | 327/202 |
| 6,353,367 B1 | | 3/2002 | Chiu | |
| 6,356,116 B1 | * | 3/2002 | Oh | 326/93 |
| 6,359,491 B1 | * | 3/2002 | Cairns et al. | 327/333 |
| 6,452,422 B1 | * | 9/2002 | Suzuki | 326/112 |
| 6,617,219 B1 | | 9/2003 | Duane et al. | |
| 6,781,459 B1 | * | 8/2004 | Brown | 330/252 |
| 6,791,343 B2 | | 9/2004 | Ramarao et al. | |
| 6,813,169 B2 | | 11/2004 | Inoue et al. | |
| 6,876,572 B2 | * | 4/2005 | Turner | 365/156 |
| 6,987,412 B2 | * | 1/2006 | Sutherland et al. | 327/333 |
| 7,224,021 B2 | | 5/2007 | Chidambarrao et al. | |
| 7,265,415 B2 | | 9/2007 | Shenoy et al. | |
| 2004/0212415 A1 | * | 10/2004 | Sutherland et al. | 327/215 |
| 2004/0233701 A1 | * | 11/2004 | Turner | 365/154 |
| 2007/0052443 A1 | * | 3/2007 | Katoch et al. | 326/31 |
| 2007/0126478 A1 | * | 6/2007 | Kapoor | 326/82 |

* cited by examiner

*Primary Examiner*—Rexford Barnie
*Assistant Examiner*—Matthew C Tabler
(74) *Attorney, Agent, or Firm*—Charles Bergere

(57) ABSTRACT

A buffer includes a source follower module and a pull-up/pull-down module that is connected to the source follower module. An output signal at the output terminal of the source follower module follows an input signal at the input terminal with a predetermined delay, independent of the Miller capacitance. The pull-up/pull-down module pulls the output of source follower to supply/ground rail.

10 Claims, 6 Drawing Sheets

US 7,400,172 B2

MILLER CAPACITANCE TOLERANT BUFFER ELEMENT

BACKGROUND OF THE INVENTION

The present invention relates generally to digital systems, and more specifically, to clock/data buffer elements used in synchronous digital systems.

A clock distribution tree is a network comprising buffers, inverters and flip-flops that are connected together to provide synchronized clock signals in a synchronous digital system. In a MOSFET transistor, the input capacitance changes in response to variations in output load. More particularly, the input capacitance due to the overlap capacitance between the gate and drain of the transistor is partially reflected back to an output of preceding stage driver. The input capacitance of the buffer is proportional to the size of transistors (or output load of the buffer which in turn reflects the size of transistors). The gate-drain overlap capacitance of a MOSFET transistor is multiplied by gain and reflected at gate because of Miller Effect and known as the Miller Capacitance. Standard library cells with a small number of stages of transistors, such as inverters, buffers, and NAND gates, are most affected by Miller Effect. Hence, in a digital system design, Miller Effect is pronounced in the design of clock distribution trees, which typically consist of standard cell buffers and inverters. Miller Effect is more dominant in deep sub-micron designs such as c90 and c65 due to shrinking geometries and likely to get worse in 45 nm and beyond.

There is substantial variation in the output load and the input signal transition time of clock tree elements between the logic synthesis phase, the post-clock tree design phase, and the post-route phase of a digital system design. This unpredictable nature of Miller capacitance may cause timing mismatches between the functional design and the post-layout design of a digital system. Current digital systems avoid timing mismatches by taking into account Miller Effect during the logic synthesis phase. This is achieved by using larger drive cells than required. The use of large drive cells increases power consumption. This approach may also result in unexpected hold time failures. Another approach used to rectify timing mismatches is to manually fix the post-layout timing.

It is desirable to design buffer elements used in a clock tree that are not susceptible to Miller Effect.

BRIEF DESCRIPTION OF THE DRAWINGS

The following detailed description of the preferred embodiments of the present invention will be better understood when read in conjunction with the appended drawings. The present invention is illustrated by way of example and not limited by the accompanying figures, in which like references indicate similar elements.

DETAILED DESCRIPTION OF THE PRESENT INVENTION

Figure 1:
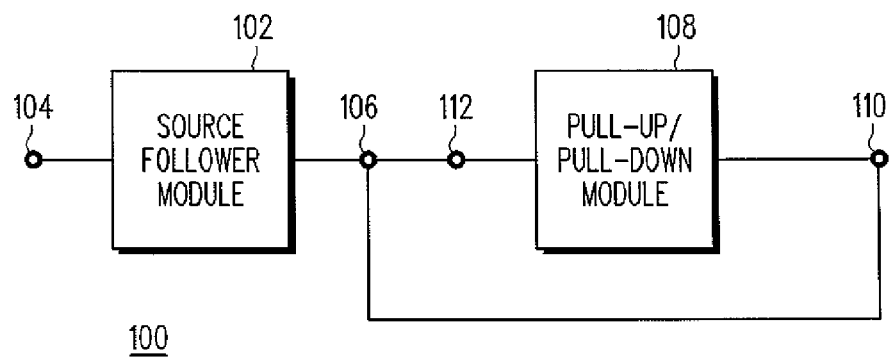
FIG. 1 is a schematic block diagram of a Miller capacitance tolerant buffer element, in accordance with an embodiment of the present invention.

The detailed description, in connection with the appended drawings, is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a buffer-element for use in a clock tree or data path is provided. The buffer element includes a source follower module having an input terminal and an output terminal. The output signal at the output terminal follows the input signal at the input terminal with a predetermined delay, which is independent of Miller capacitance. The buffer element also includes a pull-up/pull-down module that is connected to the source follower module. The pull-up/pull-down module includes an input terminal that is connected to the output terminal of the source follower module and an output terminal that is again connected to the output terminal of the source follower module hence forming a latch circuit. The pull-up/pull-down module helps in pulling the output signal to rail, i.e., supply and ground voltage.

In another embodiment of the present invention, a buffer element for use in a clock tree or data path is provided. The buffer element includes a source follower module and a pull-up/pull-down module. The source follower module includes an input terminal and an output terminal. An output signal at the output terminal follows an input signal at the input terminal with a predetermined delay, which is independent of Miller capacitance. The pull-up/pull-down module is connected to the source follower module. The pull-up/pull-down module includes an input terminal which is connected to the input terminal of the source follower module, and an output terminal which is connected to the output terminal of the source follower module. The pull-up/pull-down module helps in pulling the output signal to rail, i.e., supply and ground voltage levels.

In yet another embodiment of the present invention, a buffer element for use in a clock tree or data path is provided. The buffer element includes a source follower module and a pull-up/pull-down module with an input terminal and an output terminal. The output signal at the output terminal follows an input signal at the input terminal. The pull-up/pull-down module is connected to the source follower module. The pull-up/pull-down module has an input terminal and an output terminal. The input terminal of the pull-up/pull-down module is connected to the input terminal of the source follower module while the output module of the pull-up/pull-down module is connected to the output terminal of the source follower module. The pull-up/pull-down module helps in pulling the output signal to rail, i.e., supply and ground.

Embodiments of the present invention provide a Miller capacitance tolerant buffer element. The buffer element is especially useful in clock tree or data path. The clock tree or data path employing the buffer elements are tolerant to input capacitance variation because the gain of the source follower module used is less than or approximately equal to unity. The output signal of a buffer element with a unity gain source follower module closely follows the input. The variation in the input capacitance of such a buffer element is less with changes in the output load and the input signal transition time. The post-clock-tree timing and the post-route timing of a design using such a buffer element can be easily predicted. This results in predictable performance, better silicon yield, and faster timing convergence. The Miller capacitance tolerant buffer element can be used in any integrated circuit that requires accurate clock delays.

Referring now to FIG. 1, a schematic block diagram of a buffer element 100 comprising a source follower module 102 and a pull-up/pull-down module 108 is shown, in accordance with an embodiment of the present invention. Typically, the voltage gain is less than or close to unity in a source follower module (also referred to as common drain module). Hence, the voltage at the output of a source follower follows the input. The pull-up/pull-down module 108 helps in pulling the output signal to rail, i.e., supply and ground to ensure full swing in output waveform. The input to the buffer element 100 is provided at an input terminal 104 of the source follower module 102. An output terminal 106 of the source follower module 102 is connected to an output terminal 112 of the pull-up/pull-down module 108. Further, an input terminal 110 of the pull-up/pull-down module 108 is connected to the output terminal 106 of the source follower module 102.

Miller capacitance is dependent on the output load and the input signal transition time. The Miller Capacitance is dependent on the voltage gain of the source follower module 102 as given by the relation:

$$C_{Miller} = C_{gd}(1 - A_v); \text{ where}$$

$C_{Miller}$ is the Miller capacitance;

$C_{gd}$ is the capacitance between gate and drain; and $A_v$ is the voltage gain of the source follower module 102.

Since the gain of the source follower module 102 is always less than unity, the effect of Miller capacitance is diminished. The pull-up/pull-down module 108 helps in pulling the output voltage 106 to rail.

Figure 2:
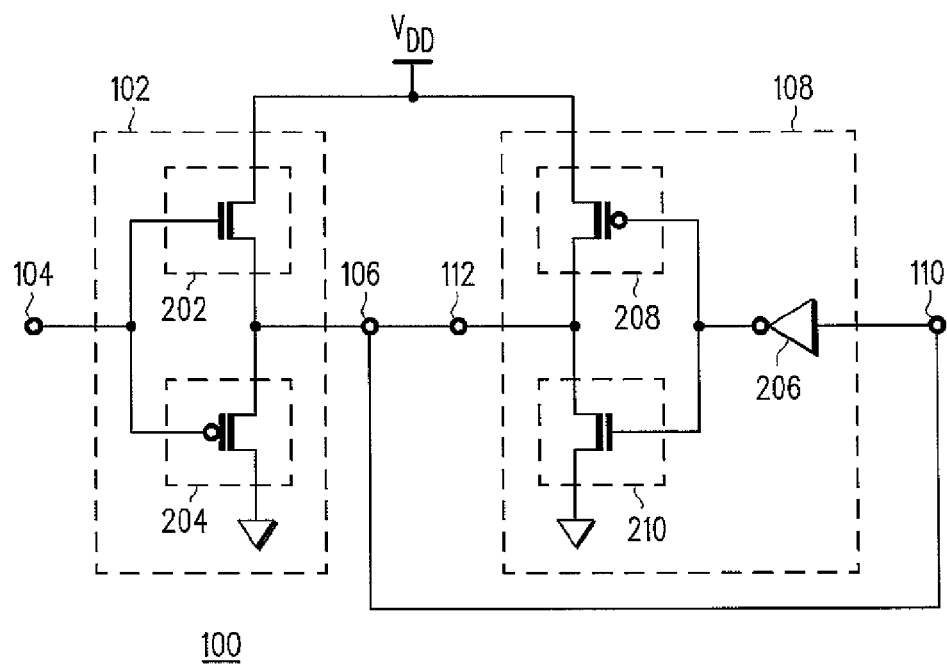
FIG. 2 is a schematic circuit diagram of the buffer element in FIG. 1, in accordance with an embodiment of the present invention.

Referring now to FIG. 2, a circuit diagram of the buffer element 100 of FIG. 1 is shown, in accordance with an embodiment of the present invention. The source follower module 102 includes a first Negative-Channel Metal Oxide Semiconductor (NMOS) transistor 202 and a first Positive-Channel Metal Oxide Semiconductor (PMOS) transistor 204. The gate terminals of the first NMOS transistor 202 and the first PMOS transistor 204 are connected to the input terminal 104 of the source follower module 102. The drain of the first PMOS transistor 204 is grounded, while the source of the first PMOS transistor 204 is connected to the output terminal 106 of the source-follower module 102. The drain of the first NMOS transistor 202 is connected to a DC supply voltage ($V_{dd}$), while the source of the first NMOS transistor 202 is connected to the output terminal 106 of the source follower module 102.

The pull-up/pull-down module 108 pulls the output voltage 106 to rail (i.e., supply ($V_{dd}$) and ground). The pull-up/pull-down module 108 includes a second NMOS transistor 210 and a second PMOS transistor, 208. The pull-up/pull-down module 108 also includes an inverter 206. The input terminal of the inverter 206 is connected to the input terminal 110 of the pull-up/pull-down module 108, while the output terminal is connected to the gates of the second PMOS and NMOS transistors 208 and 210. The drain of the second NMOS transistor 210 is connected to the output terminal 112 of the pull-up/pull-down module 108, and the source of the second NMOS transistor 210 is connected to ground. The drain of the second PMOS transistor 208 is connected to the output terminal 112 of the pull-up/pull-down module 108, and the source of the second PMOS transistor 208 is connected to the DC supply voltage ($V_{dd}$). Further, the output of the buffer element 100 is measured from the output terminal of the source follower module 102. Since the gain of the source follower module 102 is less than unity, the effect of the Miller capacitance is reduced.

Figure 3:
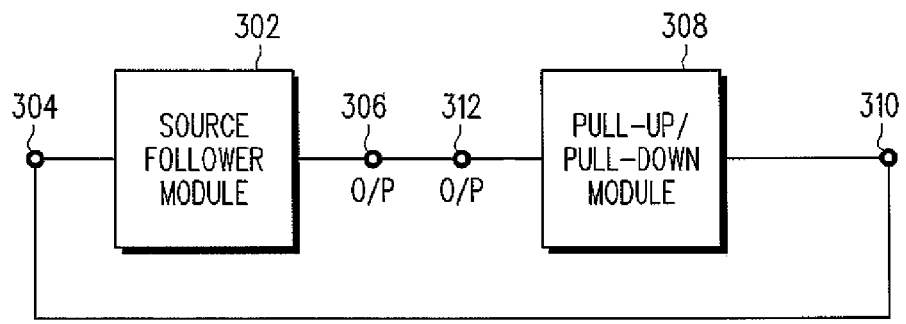
FIG. 3 is a schematic block diagram of a Miller capacitance tolerant buffer element, in accordance with another embodiment of the present invention.

Referring now to FIG. 3, a schematic block diagram of a buffer element 300 comprising a source follower module 302 and a pull-up/pull-down module 304 is shown, in accordance with another embodiment of the present invention. The source follower module 302 and the pull-up/pull-down module 308 are connected together in a feedback loop, as shown in FIG. 3. The input to the buffer element 300 is provided at an input terminal 304 of the source-follower module 302. An output terminal 306 of the source-follower module 302 is connected to an output terminal 312 of the pull-up/pull-down module 308. An input terminal 310 of the pull-up/pull-down module 308 is also connected to the input terminal 304 of the source-follower module 302.

Figure 4:
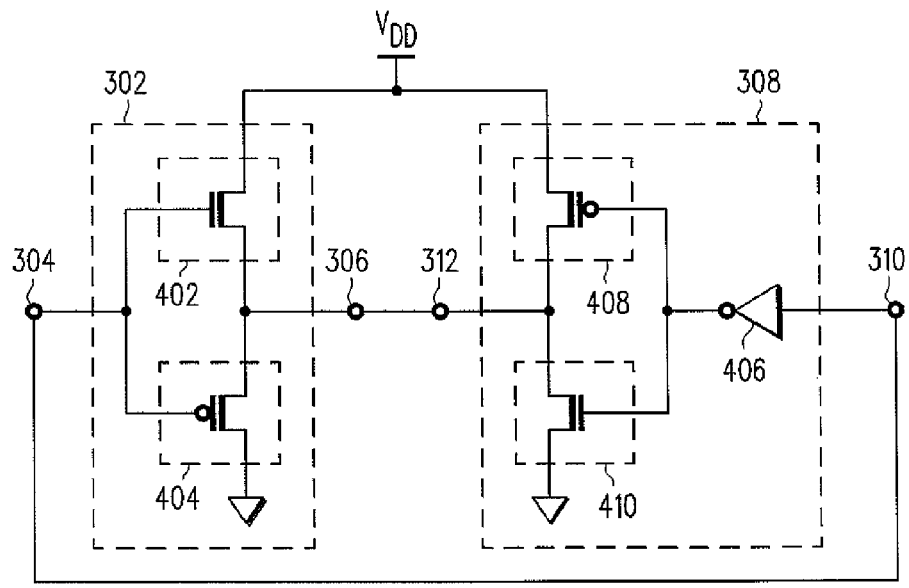
FIG. 4 is a schematic circuit diagram of the buffer element in FIG. 3, in accordance with an embodiment of the present invention.

Referring now to FIG. 4, a circuit diagram of the buffer element 300 of FIG. 3 is shown, in accordance with an embodiment of the present invention. The source follower module 302 includes a first NMOS transistor 402 and a first PMOS transistor 404. The gate terminals of the first NMOS transistor 402 and the first PMOS transistor 404 are connected to the input terminal 304 of the source follower module 302. The drain of the first NMOS transistor 402 is connected to the DC supply voltage (Vdd), while the source is connected to the output terminal 306 of the source follower module 302. Similarly, the source of the first PMOS transistor 404 is connected to the output terminal 306 of the source follower module 302, while the drain is connected to ground. The output terminal 306 of the source follower module 302 is connected to the output terminal 312 of the pull-up/pull-down module 308. The pull-up/pull-down module 308 includes an inverter 406, a second PMOS transistor 408 and a second NMOS transistor 410. The input terminal of the inverter 406 is connected to the input terminal 310 of the pull-up/pull-down module 308, while the output terminal of the inverter 406 is connected to the gates of the second PMOS and NMOS transistors 408 and 410. The source of the second PMOS transistor 408 is connected to a DC supply voltage (Vdd), while the drain is connected to the output terminal 312 of the pull-up/pull-down module 308. The drain of the second NMOS transistor 410 is connected to the output terminal 312 of the pull-up/pull-down module 308, while the source of the second NMOS transistor 410 is connected to ground.

Figure 5:
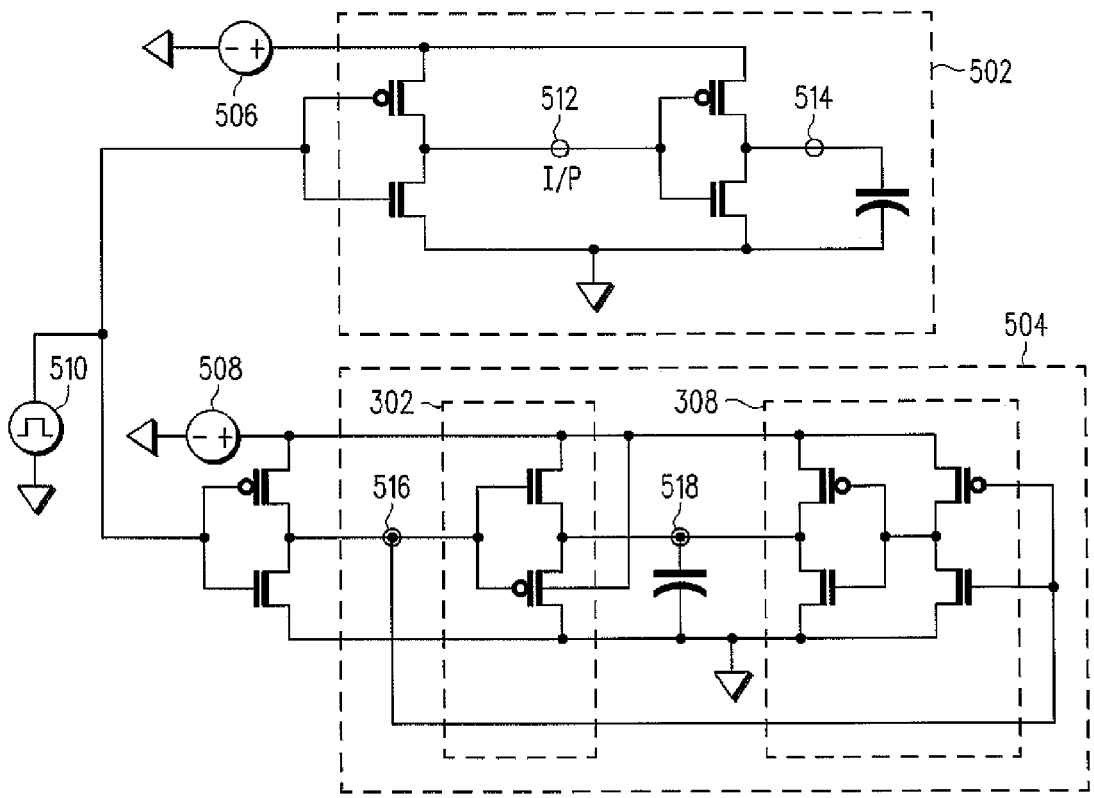
FIG. 5 is a schematic circuit diagram illustrating a conventional inverter buffer and a buffer employing the Miller capacitance tolerant buffer element in FIG. 4, connected to determine comparisons between the two buffers via simulation.

Referring now to FIG. 5, a circuit diagram of a simulation set-up 500 including a conventional inverter buffer 502 and a Miller capacitance tolerant buffer element 504 (also referred to herein as Miller cap buffer 504) in accordance with the present invention is shown. The simulation set-up 500 includes first, second and third sources 506, 508, and 510. The miller cap buffer 504 includes the source follower module 302, the pull-up/pull-down module 308, an input terminal 516, and an output terminal 518. Simulations on the set-up were performed by applying a common input pulse signal from the third voltage source 510. This simulation setup was for one tone comparison of the Miller cap buffer of the present invention with a conventional buffer having the same drive strength.

Figure 6:
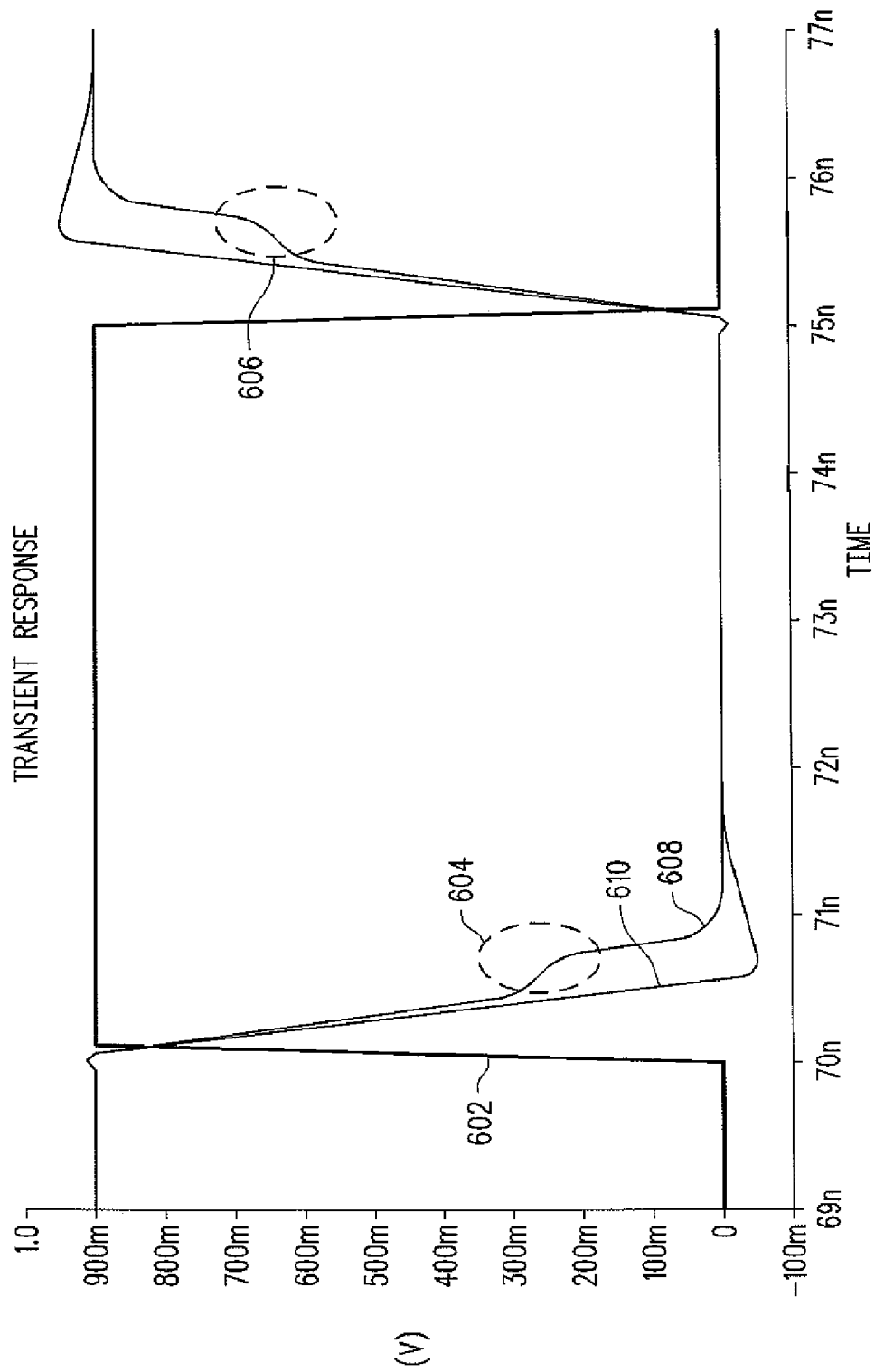
FIG. 6 is a waveform diagram illustrating simulation results of the two buffer circuits shown in FIG. 5.

Referring now to FIG. 6, a waveform diagram illustrating simulation results for comparing the operation of the conventional buffer circuit 502 and the miller cap buffer 504. The waveform diagram shows a comparison between the transient response of the input voltage of the conventional inverter buffer 502 and the miller cap buffer 504, when the common input pulse from the third voltage source 510 is applied through an inverter. The waveform diagram shows the input voltage (Y-axis) versus time (X-axis). A single unit on the X-axis represents one nanosecond (starting at 69 nS), while a single unit on the Y-axis represents 100 millivolts (starting at −100 mV). The common input pulse shown in FIG. 6 is represented by the waveform 602. The voltage at the Input of the conventional inverter buffer 502 is represented by the voltage waveform 608, and the voltage at the input of the miller cap buffer 504 is represented by the voltage waveform 610. As shown in the waveform diagram of FIG. 6, the conventional buffer experiences distortions 604 and in the input voltage due to Miller Effect, while the miller cap buffer 504 does not exhibit any variation in voltage with respect to the Miller Effect, as depicted by the voltage waveform 610.

Figure 7:
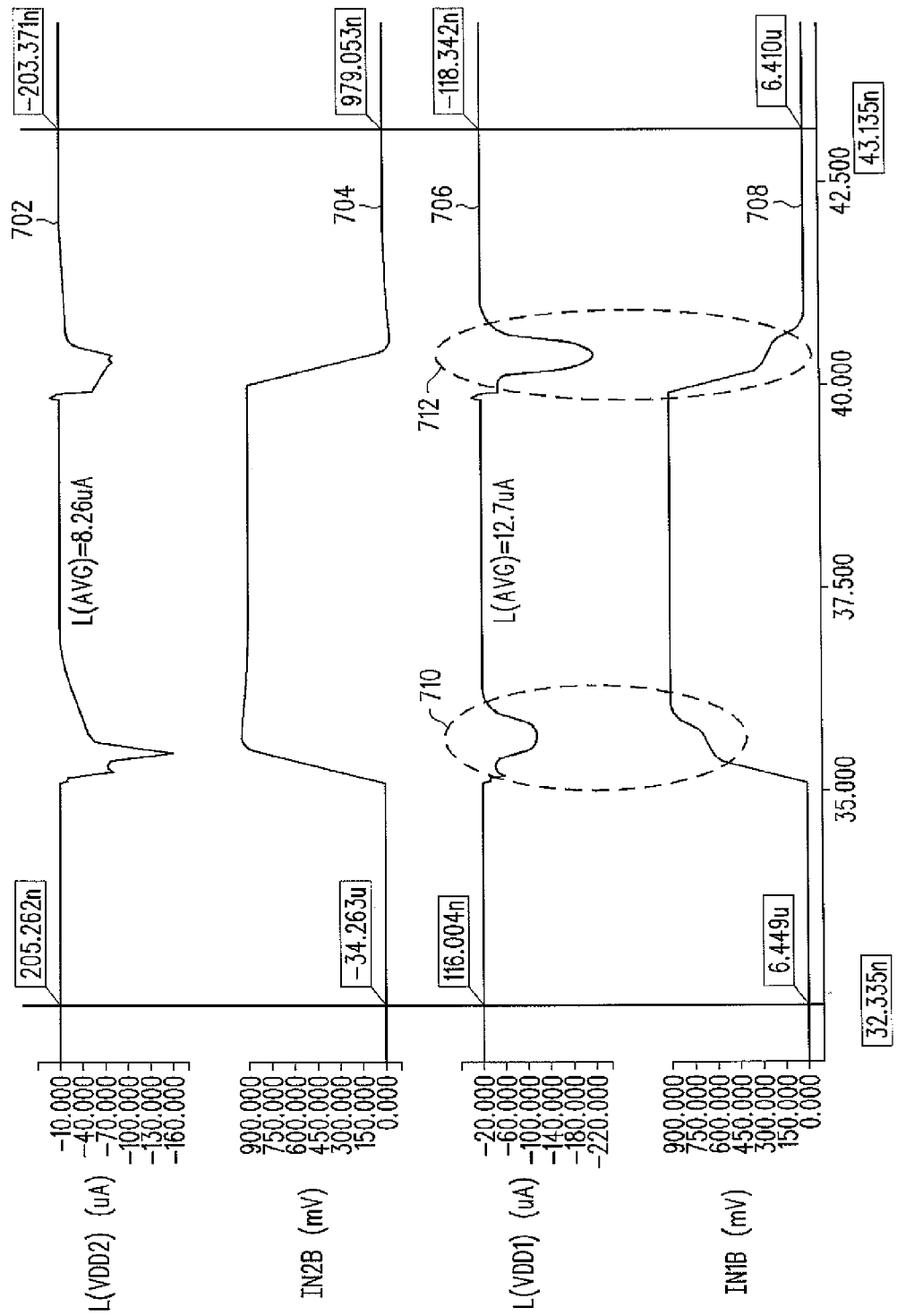
FIG. 7 is a waveform diagram illustrating a comparison between the current consumption at a Worst Case Scenario (WCS) process corner for the two buffer circuits shown in FIG. 5

Referring now to FIG. 7, a waveform diagram illustrating a comparison of the current consumption at the Worst Case Scenario (WCS) of the conventional buffer 502 and the miller cap buffer 504 is shown. The waveform 702 shows the transient response of current supplied by the second voltage source 508 at WCS. The waveform 704 shows the transient response of the voltage signal at input terminal 516 at WCS. The waveforms 706 and 708 show the transient response of the current supplied by the first voltage source 506 and the voltage signal at the input terminal 512, respectively. The encircled regions 710 and 712 show 712 show distortion in the waveform 708 and the current through the first voltage source 506 in the waveform 706 that occur due to the Miller Effect in the conventional buffer 502. As shown by the waveforms 702 and 706, the average current consumption in the conventional buffer 502 is higher (12.7 µa) than the current consumption in the Miller cap buffer 504 (8.26 µa). Therefore, the power consumption in the conventional buffer 502 is greater than that in the Miller cap buffer 504. This excessive current in the conventional buffer 502 is mainly caused by the distortion in the input waveform due to the Miller effect.

Figure 8:
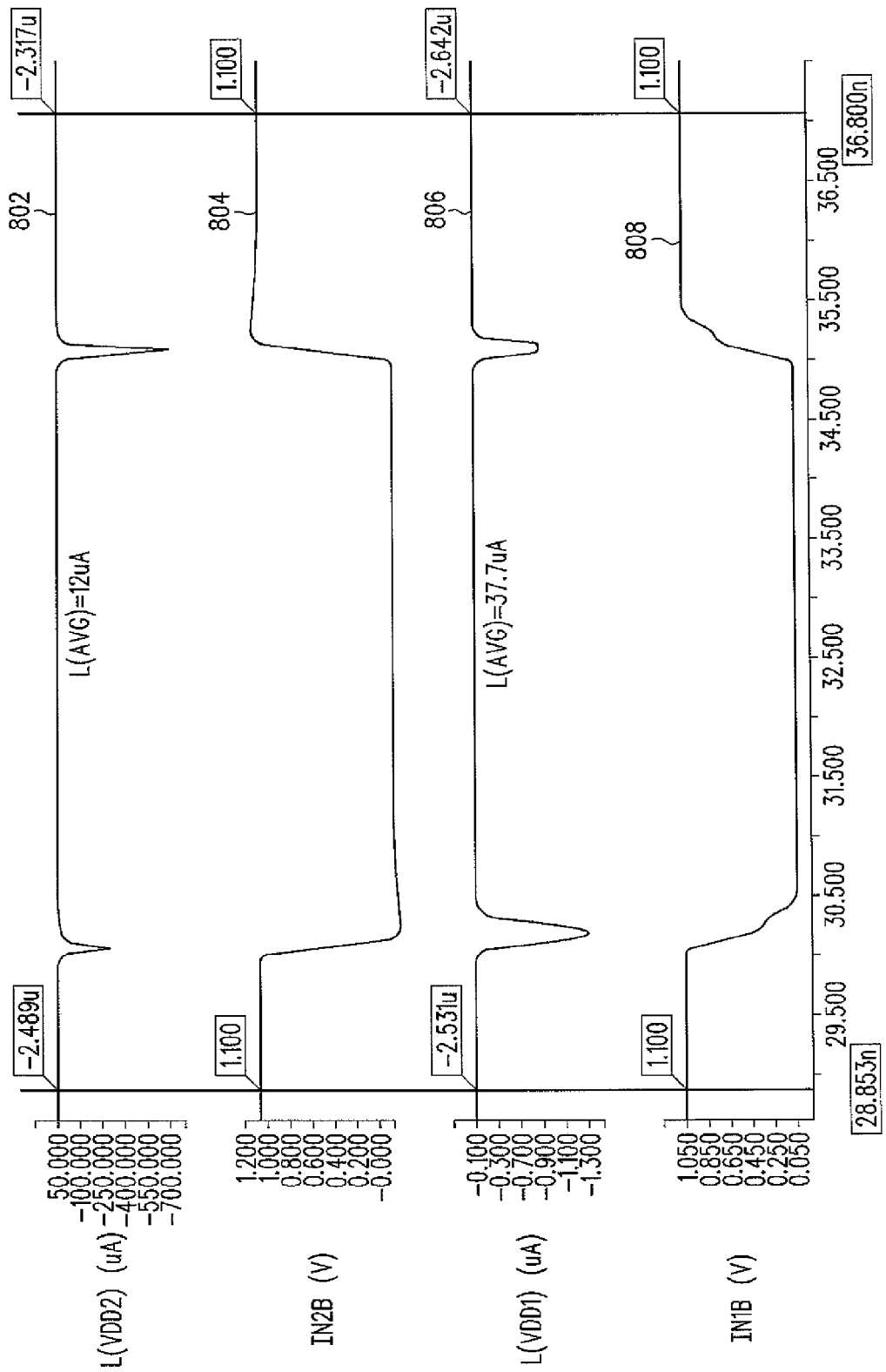
FIG. 8 is a waveform diagram illustrating a comparison between the current consumption at a Best Case Scenario (BCS) process corner for the two buffer circuits shown in FIG. 5.

Referring now to FIG. 8, a waveform diagram illustrating a comparison of current consumption at Best Case Scenario (BCS) between the conventional buffer 502 and the Miller cap buffer 504 is shown. A waveform 802 shows the transient response of current supplied by the second voltage source 508 at BCS. The waveform 804 shows the transient response of a voltage signal at input terminal 516 at BCS. The waveforms 806 and 808 show the transient response of the current supplied by the first voltage source 506 and the voltage signal at input terminal 512, respectively. As shown by the waveforms 802 and 806, the average current consumption in the conventional buffer 502 is higher (37.7 µa) than the current consumption in the miller cap buffer 504 (12 µa). Therefore, the power consumption in the conventional buffer 502 is greater than that in the miller cap buffer 504.

Figure 9:
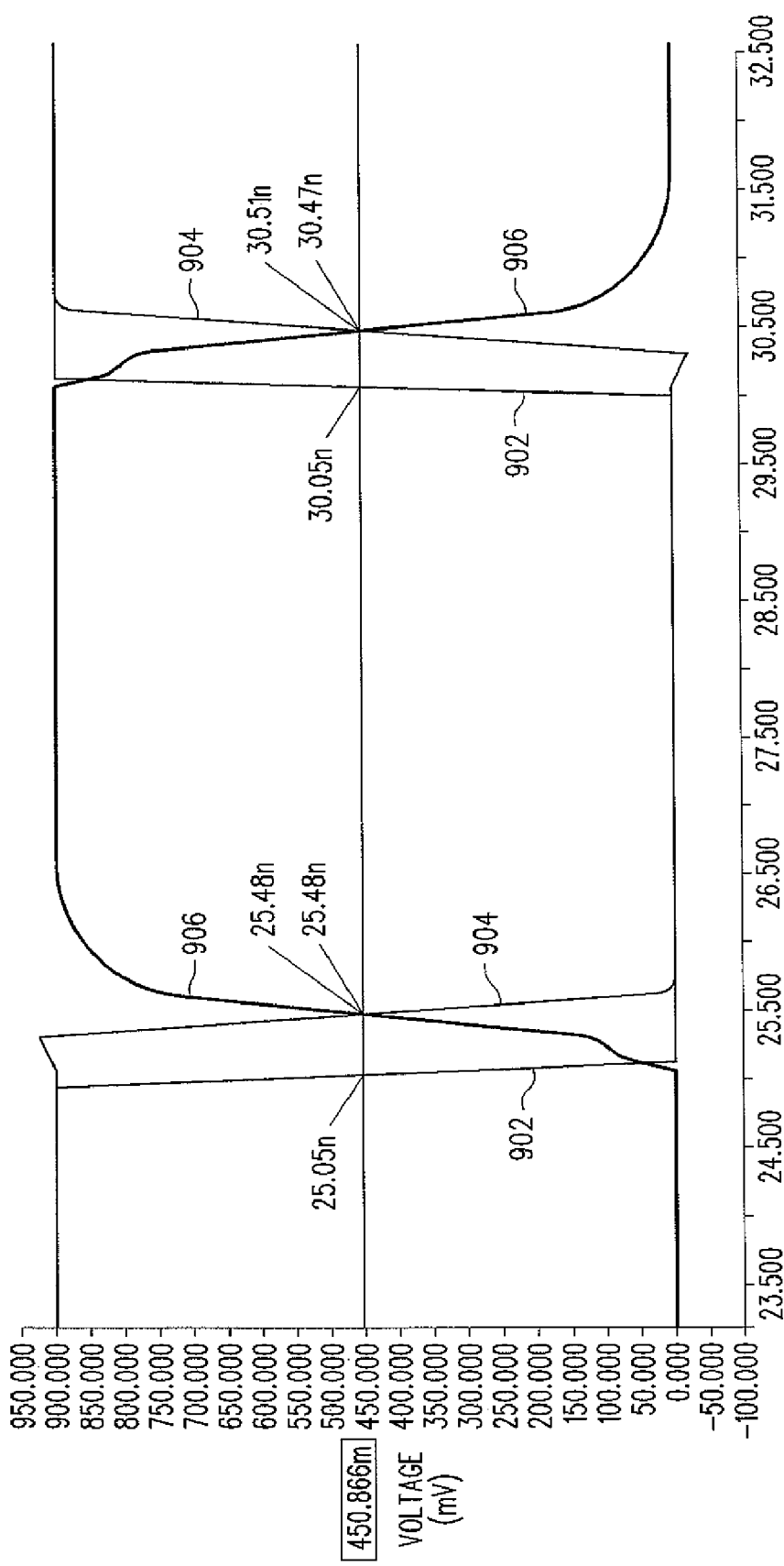
FIG. 9 is a waveform diagram illustrating a comparison of the transient responses, showing the buffer delays of the two buffer circuits shown in FIG. 5.

Referring now to FIG. 9, a waveform diagram illustrating a comparison of signal delay in the conventional inverter buffer 502 and the miller cap buffer 504 is shown. A waveform 902 represents the input voltage provided by the third voltage source 510. A waveform 904 depicts the output voltage at the output terminal 514 of the conventional inverter buffer 502 and a waveform 906 depicts the output voltage at the output terminal 518 of the miller cap buffer 504. The inverted waveform 906 is due to extra inverter added at the input of the Miller cap buffer. As shown by the waveforms 904 and 906, corresponding to the 50 percent fall in the waveform 902 at the time (25.05 ns), the signals at the output of the conventional buffer 502 and the Miller cap buffer 504 both reach 50 percent of their maximum voltage value at the same time (25.48 ns). As shown in the waveform diagram corresponding to the 50 percent rise in the waveform 902 at the time (30.05 ns), the signal at the output of the conventional inverter buffer 502 reaches 50 percent of the maximum value at 30.47 ns, while that at the output of the Miller cap buffer 504 reaches 50 percent of the maximum value at 30.51 ns. Hence the delay of the Miller cap buffer 504 is not deteriorated and comparable to that of conventional buffer.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A buffer element for use in a clock tree and data path, the buffer element comprising:
   a source follower module having an input terminal and an output terminal, wherein an output signal at the output terminal follows an input signal at the input terminal with a predetermined delay as the gain of the source follower module is less than or close to unity; and
   a pull-up/pull-down module connected to the source follower module, the pull-up/pull-down module having an input terminal connected to the source follower module output terminal and an output terminal connected to the source follower module output terminal, wherein the pull-up/pull-down module pulls the output of the source follower module to supply/ground rail, and wherein the predetermined delay is independent of Miller capacitance.

2. The buffer element of claim 1, wherein the output terminal of the source follower module is an output voltage terminal.

3. The buffer element of claim 1, wherein the source follower module comprises:
   a first Positive-Channel Metal Oxide Semiconductor (PMOS) transistor having a gate connected to the input terminal of the source follower module, a source connected to the output terminal of the source follower module and a drain connected to ground; and
   a first Negative Metal Oxide Semiconductor (NMOS) transistor having a gate connected to the input terminal of the source follower module, a source connected to the output terminal of the source follower module and a drain connected to a supply voltage.

4. The buffer element of claim 3, wherein the pull-up/pull-down module comprises an inverter having an input terminal connected to the input terminal of the pull-up module, and an output terminal.

5. The buffer element of claim 4, wherein the pull-up/pull-down module further comprises:
   a second NMOS transistor having a gate connected to the output terminal of the inverter, a drain connected to the output terminal of the pull-up/pull-down module and a source connected to ground; and a second PMOS transistor having a gate connected to the output terminal of the inverter, a drain connected to the output terminal of the pull-up/pull-down module and a source connected to the supply voltage.

6. A buffer element for use in a clock tree or data path, the buffer element comprising:

a source follower module having an input terminal and an output terminal, wherein an output signal at the output terminal follows an input signal at the input terminal with a predetermined delay as gain of the source follower module is less than unity; and a pull-up/pull-down module connected to the source follower module, the pull-up/pull-down module having an input terminal connected to the input terminal of the source follower module, and an output terminal connected to the output terminal of the source follower module, wherein the pull-up/pull-down module pulls the output of source follower to supply/ground rail, and wherein the delay is independent of Miller capacitance.

7. The buffer element of claim 6, wherein the output terminal of the source follower module is an output voltage terminal.

8. The element of claim 6, wherein the source follower module comprises:

a first PMOS transistor having a gate connected to the input terminal of the source follower module, a source connected to the output terminal of the source follower module and a drain connected to ground; and a first NMOS transistor having a gate connected to the input terminal of the source follower module, a source connected to the output terminal of the source follower module and a drain connected to a supply voltage.

9. The buffer element of claim 8, wherein the pull-up module comprises an inverter having an input terminal connected to the input terminal of the pull-up module, and an output terminal.

10. The buffer element of claim 9, wherein the pull-up/pull-down module further comprises:

a second NMOS transistor having a gate connected to the output terminal of the inverter module, a drain connected to the output terminal of the pull-up/pull-down module and a source connected to ground; and a second PMOS transistor having a gate connected to the output terminal of the inverter module, a drain connected to the output terminal of the pull-up/pull-down module and a source connected to the supply voltage.

* * * * *